United States Patent [19]

Yurash

[11] Patent Number: 5,463,338

[45] Date of Patent: Oct. 31, 1995

[54] DUAL LATCH CLOCKED LSSD AND METHOD

[75] Inventor: Stephen A. Yurash, Palo Alto, Calif.

[73] Assignee: VLSI Technology, Inc., San Jose, Calif.

[21] Appl. No.: 75,363

[22] Filed: Jun. 7, 1993

[51] Int. Cl.[6] .................................................. H03K 3/289
[52] U.S. Cl. ......................... 327/202; 327/144; 327/212; 377/78
[58] Field of Search .......................... 307/271.1, 271.2, 307/291, 288, 279; 327/202, 144, 212, 215, 219, 214; 377/78

[56] References Cited

U.S. PATENT DOCUMENTS

| | | | |
|---|---|---|---|
| 4,298,980 | 11/1981 | Hajdu et al. | 371/25 |
| 4,476,431 | 10/1984 | Blum | 324/73 |
| 4,495,628 | 1/1985 | Zasio | 377/70 |
| 4,495,629 | 1/1985 | Zasio | 377/70 |
| 4,542,509 | 9/1985 | Buchanan et al. | 371/61 |
| 4,553,236 | 11/1985 | Zasio | 371/15 |
| 4,554,664 | 11/1985 | Schultz | 371/25 |
| 4,569,067 | 2/1986 | Gallup | 307/272.2 |
| 4,580,137 | 4/1986 | Fiedler et al. | 340/825.68 |
| 4,587,480 | 5/1986 | Zasio | 324/73 |
| 4,597,042 | 6/1986 | d'Angeac et al. | 364/200 |
| 4,649,539 | 3/1987 | Crain et al. | 371/25 |
| 4,780,874 | 10/1988 | Lenoski et al. | 371/25 |
| 4,782,283 | 11/1988 | Zasio | 324/73 |
| 4,843,254 | 6/1989 | Motegi et al. | 307/272.2 |
| 4,855,669 | 8/1989 | Mahoney | 324/73 |
| 5,015,875 | 5/1991 | Giles et al. | 307/272.2 |
| 5,105,100 | 4/1992 | Yamada | 307/272.2 |
| 5,130,568 | 7/1992 | Miller et al. | 324/158 R |
| 5,155,432 | 10/1992 | Mahoney | 324/158 R |
| 5,175,447 | 12/1992 | Kawasaki et al. | 307/272.2 |
| 5,189,315 | 2/1993 | Akata | 307/272.2 |
| 5,239,206 | 8/1993 | Yanai | 307/272.2 |

FOREIGN PATENT DOCUMENTS

| | | | |
|---|---|---|---|
| 0224004 | 6/1987 | European Pat. Off. | |
| 4131075A1 | 3/1992 | Germany | 19/8 |
| WO84/03012 | 8/1984 | WIPO | 3/356 |

OTHER PUBLICATIONS

Needham, Wayne, "Testing", The Electrical Engineering Handbook, CRC Press, Inc., 1993, pp. 491–499.

Serra, Micaela et al., "Digital IC Testing", The Electrical Engineering Handbook, CRC Press, Inc., 1993, pp. 1809–1837.

Primary Examiner—Timothy P. Callahan
Assistant Examiner—My Trang Nu Ton
Attorney, Agent, or Firm—Paul Hickman

[57] ABSTRACT

A digital integrated circuit provided with a dual latch clocked LSSD that includes a master latch coupled to a slave latch such that it operates in at least three operational modes. Preferably the three modes of the dual latch clocked LSSD include a functional mode, a capture mode, and a shift mode. In the functional mode, the dual latch clocked LSSD operates as an edge-triggered flip-flop storage element. In the capture mode, the dual latch clocked LSSD operates as a level sensitive latch storage element controlled by the system clock, one of two scan clock signals, and, preferably, by a test mode input signal. In the shift mode, the dual latch clocked LSSD again operates as a level sensitive latch storage element, but is controlled by a pair of shift clocks. By separating the capture mode from the functional mode, the dual latch clocked LSSD is exceptionally resistant to skew problems in both the capture and the shift modes.

23 Claims, 6 Drawing Sheets

| TYPE | Functional | Operator | Capture | Operator | Shift | Operator |
|---|---|---|---|---|---|---|
| LSSD | Level | CLK | N/A | N/A | Level | A, B |
| Muxed Flop | Edge | CLK | N/A | N/A | Edge | CLK |
| 3-Latch Clocked LSSD | Edge | CLK | N/A | N/A | Level | A, B |
| Dual Latch Clocked LSSD | Edge | CLK | Level | CLK, Test, B | Level | A, B |

Fig. 7

DUAL LATCH CLOCKED LSSD AND METHOD

BACKGROUND OF THE INVENTION

This invention relates generally to digital integrated circuits and more particularly to digital integrated circuits including level-sensitive scan design (LSSD) storage elements, muxed-flop design storage elements, or clocked LSSD design storage elements, in which the storage elements have both a functional and a shift mode of operation.

Digital integrated circuits often include a great number of storage elements, such as latches or flip-flops, which temporarily store logical states within the integrated circuit. There are several situations in which it is useful to be able to set the states of such latches and flip-flops. For example, if it is desired to operate an integrated circuit from a known initial state, it is often necessary to be able to input states into the various latches and flip-flops of the integrated circuit from an external data pin. Also, it is useful to be able to test such an integrated circuit by shifting a test vector comprised of a sequence of "bits" through a chain of latches and/or flip-flops to ensure that the integrated circuit is functioning properly. In view of the foregoing, various specialized storage elements (latches and/or flip-flops) were developed which have two modes of operation. In a first mode of operation, the storage elements are set in a "functional" mode such that the integrated circuit performs its normal operational tasks. In a second or "shift" mode, data is sequentially shifted through the storage elements and out an output pin of the integrated circuit for diagnostic analysis.

In FIG. 1, a simplified schematic of an integrated circuit I is shown to include three modules, M1, M2, and M3. Digital integrated circuits are often designed in modular form, wherein each module performs a particular, global function, such as memory, logic, input/output, etc. Each of the modules M1, M2, and M3, can include storage elements E. As explained previously, these storage elements can comprise latches (which are level-sensitive devices) or flip-flops (which are edge-triggered devices), as is well known to those skilled in the art. Each of these storage elements E can hold a "state", i.e., can be a logical high ("HI"), or a logical low ("LO").

With continuing reference to FIG. 1, module M1 can be electrically coupled to a pair of input pins, here labeled "Shift In #1," and "CLK #1." Data applied to the "Shift In #1" pin is shifted into the series of storage elements E with each clock pulse on pin "CLK #1 ." In this way, the states of the storage elements E in module M1 can be set to a known state. Likewise, the storage elements E of module M2 can be set to a known state by placing data on pin "Shift In #2" and applying clock pulses to pin "CLK #2." If module M2 includes "n" storage elements E, after n+1 clock pulses on input pin "CLK 2" data from "Shift In #2" will start shifting out on pin "Shift Out #2."

The situation gets more complicated with respect to module M3. The module M3 also includes a number of storage elements E, but the data entering module M3 is developed by internal logic of module M1. Also, the clock for the storage elements E in module M3 is generated by the logic of module M1. In this instance, the prior art has been unable to scan-in data to an internal or "buried" module M3 so as to reliably set the states of the storage elements E.

The block diagram of FIG. 1 illustrates the storage elements E when they are in the second, or "shift" mode. The interconnections of the storage elements E with each other and with other circuit elements when in the functional mode are not illustrated in FIG. 1. The prior art provides well known methods and circuitry (not shown) for switching the storage elements E between the shift mode and the normal, functional mode.

The prior art discloses three basic ways of creating storage elements with the aforementioned two modes of operation. A first prior art method is known as level-sensitive scan design (LSSD) where, in the functional mode, the storage element is a level-sensitive latch controlled by the system clock and, when in the shift mode, the storage element is a latch sensitive to two non-overlapping level-sensitive clocks. Since it is a level-sensitive design, LSSD methodology is not very sensitive to clock skew. However, the problem with LSSD is that it is level rather than edge triggered in the functional mode, which requires significantly different clock distribution techniques from edge triggered design, and entails more design methodology restrictions.

A second methodology is known as the "muxed flop" (i.e. multiplexed flip-flop) design. Muxed flop design is currently the most popular methodology for creating storage elements for integrated circuits having two modes of operation. However, muxed flop design has a moderate area penalty and also has a moderate speed penalty over LSSD. It is furthermore quite sensitive to clock skew in the shift mode.

A design implementation which is a hybrid between LSSD design and muxed flop design is known as "clocked LSSD." Like the LSSD design, it is not sensitive to scan clock skew. Existing implementations of clocked LSSD circuits have a heavy area penalty but no speed penalty over the LSSD method. As will be discussed in greater detail subsequently, the heavy area penalty exists because at least three latches are used to construct the storage elements.

In FIG. 2a, a typical prior art LSSD storage element includes a master latch and a slave latch. When in the shift mode, two clocks (which are separate from the system clock) operate in conjunction to transfer data from the master latch to the slave latch, and the scan output (SO) is developed at the Q output of the slave latch. As noted in FIG. 2a, the master and slave latches are level sensitive. A flip-flop design is similar, except the master and slave latches are both operated from the same clock, which is a merger of the two clocks of the LSSD storage element, which controls both the functional and the shift modes.

In FIG. 2b, a clocked LSSD storage element of the prior art includes three latches, wherein data is latched into the first latch at a SI input and is transferred out of a third latch at a SO output. A second latch provides a Q output when in the functional mode.

An example of the type of storage element illustrated in FIG. 2b can be found in U.S. Pat. No. 4,553,236 of Zasio (hereinafter referred to as Zasio '236). In Zasio '236, a scannable latch circuit is provided with dual isolated outputs, one of which is used as a latch output and the other of which is used as a shift register output. A computer system, in which the scannable logic is used in conjunction with combinatorial logic and error detection circuitry, may monitor the latch output for error detection and other purposes without having to slow down the system operating speed.

While Zasio '236 performs admirably, it does suffer from several drawbacks. For one, Zasio '236 pays a heavy area penalty for providing clocked LSSD functionality because it requires three latches and supporting circuitry. Secondly, since data is shifted into the latches of Zasio '236 by a edge-triggered clock, the Zasio '236 storage elements are quite vulnerable to skew when capturing data in a functional mode. Furthermore, Zasio '236 cannot deal with internal clocks, such as the internal clock of module M3 of FIG. 1.

Digital integrated circuits employing one of the aforementioned forms of dual-mode storage element technology employ Automated Test Pattern Generation ("ATPG") algorithms and software to run tests on the integrated circuit such as the "D" algorithm, "Podem", and other tests well known to those skilled in the art. It would therefore be desirable that any improved storage element technology for digital integrated circuits would be compatible with such existing ATPG algorithms and software, or at least would be able to use such ATPG algorithms and software with minimal amounts of modification.

SUMMARY OF THE INVENTION

The present invention provides a clocked LSSD that requires only two latches for operation. Instead of operating in only two modes, as in the prior art, the dual latch clocked LSSD of the present invention also operates in a third or "capture" mode. In the functional and shift modes, the present invention operates similarly to the clocked LSSD designs of the prior art. However, in the new or "capture" mode, the present clocked LSSD operates in the more skew-resistant LSSD mode. Furthermore, unlike the prior art, the present invention can deal with internally clocked modules, such as module M3 of FIG. 1.

An integrated circuit with a dual latch clocked LSSD in accordance with the present invention includes a first module responsive to a first external clock and a first external shift input and operative to produce a first shift output, where the first module includes at least one dual latch clocked LSSD having a master latch, a slave latch, and circuitry coupling the master latch to the slave latch to provide at least three operational modes, including a functional mode, a capture mode, and a shift mode. Typically, this first module includes a number of dual latch clocked LSSD's connected in series, i.e. "chained" together as a shift register. A further embodiment of the present invention includes an internal module responsive to an internal clock and to the shift output of the first module, where the internal module is operative to produce a shift output. Again, the internal module is preferably provided with a number of the dual latch clocked LSSD's.

A dual latch clocked LSSD of the present invention includes a master latch, a slave latch, and circuitry coupling the master latch to the slave latch to provide the aforementioned three operational modes. The capture mode and the shift mode of the present invention are level sensitive. The functional mode is edge triggered, which is the preferred mode for most digital designs.

A method for controlling a digital integrated circuit in accordance with the present invention includes sequencing through the modes of operation including a functional mode, a capture mode, and a shift mode. When in the functional mode, storage elements of a digital integrated circuit are clocked with an edge of a clock pulse. When in a capture mode, data is captured into the master latch by a level sensitive operation of the system clock. The slave latch does not immediately receive this data because a B clock for the slave latch overrides the system clock in the slave latch. Finally, when in a shift mode, data is shifted through the master latch with a level sensitive A clock, and through the B latch with the level sensitive B clock.

A major advantage of the present invention is that by providing three different operational modes, skew-resistant test modes (i.e. capture and shift modes) are provided. The skew resistant capture mode is very advantageous in designs with multiple clocks and/or internally generated clocks.

A further advantage of the present invention is that it provides clocked LSSD functionality in less physical space and at a lower cost, because the dual latch clocked LSSD of the present invention requires only two latches. Furthermore, the dual latch clocked LSSD of the present invention preserves the speed advantage of clocked LSSD over muxed flops.

These and other advantages of the present invention will become apparent upon reading the following detailed descriptions and studying the various figures of the drawings.

BRIEF DESCRIPTION OF THE DRAWINGS

FIG. 7 is a table comparing the operation of LSSD circuitry, muxed flop circuitry, and three-latch clocked LSSD circuitry of the prior art, and the dual latch clocked LSSD circuitry of the present invention.

DETAILED DESCRIPTION OF THE PREFERRED EMBODIMENT(S)

Figure 1:
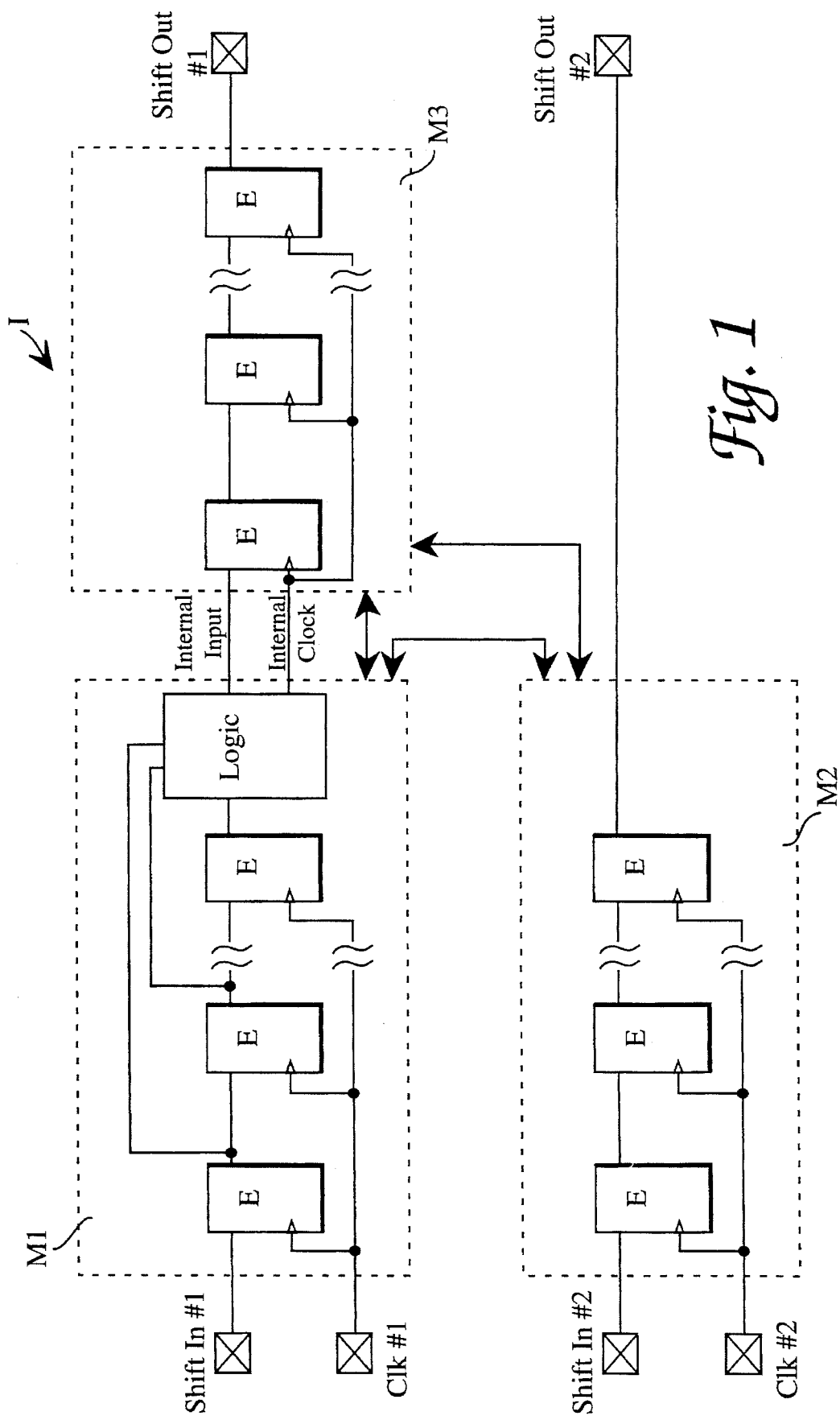
FIG. 1 is a partial block diagram of a digital integrated circuit having several modules, each of which is provided with a number of storage elements capable of operating in more than one mode.
Figure 2A:
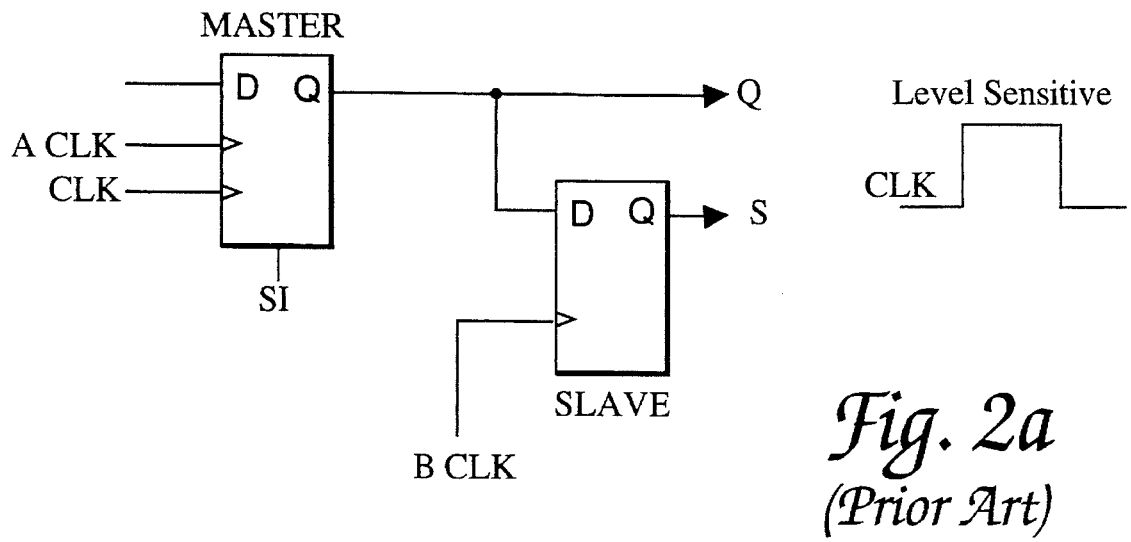
FIG. 2a is a schematic of a prior art LSSD storage element.
Figure 2B:
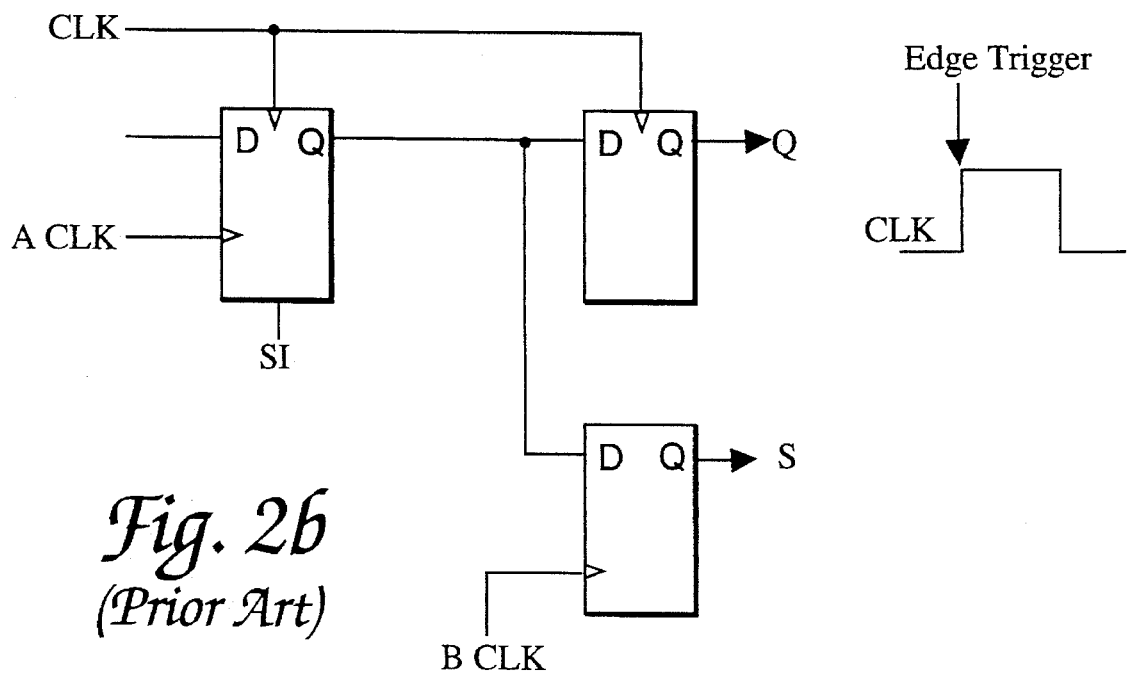
FIG. 2b is a schematic diagram of a three-latch clocked LSSD of the prior art.

FIGS. 1, 2a and 2b were discussed previously in terms of the prior art. The integrated circuit represented in FIG. 1 can also be implemented using the dual latch clocked LSSD as the storage elements E. A major advantage of using the dual latch clocked LSSDs of the present invention is that the storage elements of module M3 can be accessed by ATPG software, even though module M3 is driven by an internal clock.

Figure 3:
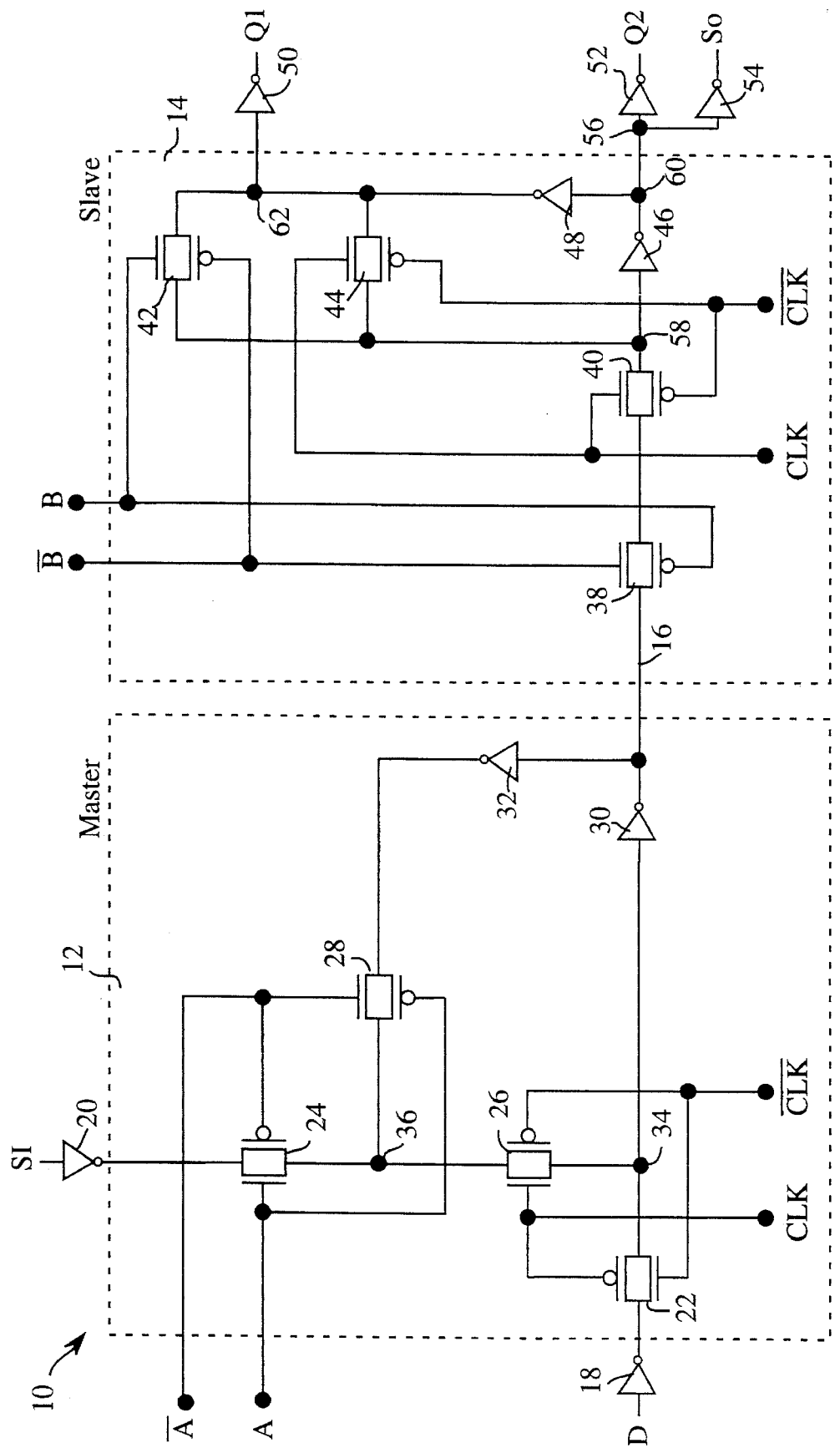
FIG. 3 is a schematic diagram of a dual latch clocked LSSD in accordance with the present invention.

In FIG. 3, a dual latch clocked LSSD storage element 10 includes a first or master latch 12, and a second or slave latch 14. The master latch 12 is responsive to a number of input signals. More specifically, the master latch 12 is responsive to a data input D, a clock input CLK, the inverse of the clock input CLK*, an A clock, a A* clock (which is the inverse of the A clock), and a "scan input" SI. In the figures, CLK* and A* are shown by the more conventional representation with an inversion bar symbol. The master latch 12 has a master latch output on a line 16. The data input D is input into the master latch 12 by means of an inverter 18, and the scan input SI is input into the master latch 12 by means of an inverter 20.

A preferred circuitry for master latch 12 includes four gates 22, 24, 26, and 28, and two inverters 30 and 32. Each of the gates 22-28 are standard CMOS transmission gates controlled by both inverting and a noninverting input. The inverting input to the gates are indicated by an inversion bubble. The gates 22–28 preferably operate at any appropriate CMOS level, e.g., between 0 and 5 volts d.c., between 0 and 3 volts d.c., etc.

As used in this description, a gate is referred to as "open" when it is conducting data through it. A transmission gate is referred to as "closed" when it is not conducting data. The inverters 30 and 32 are of conventional design. The design and manufacture of transmission gates and inverters are well known to those skilled in the art.

Inverter 18, gate 22, and inverter 30 are coupled in series between data input D and the master latch output 16. The non-inverting control input for gate 22 is coupled to the CLK* signal, and the inverting control input to gate 22 is coupled to the CLK signal. A node 34 exists between gate 22 and inverter 30.

Inverter 20, transmission gate 24 and transmission gate 26 are coupled in series between the scan input (SI) and node 34. The noninverting control input to gate 24 is coupled to the A clock and the inverting input to transmission gate 24 is coupled to the A* clock. The non-inverting control input to gate 26 is coupled to the CLK input, and the inverting control input to gate 26 is coupled to the CLK* input. A node 36 is formed between gates 24 and 26. Inverter 32 and gate 28 are coupled in series between the master latch output 16 and the node 36. The noninverting control input to gate 28 is coupled to the A* input and the inverting control input to gate 28 is coupled to the A input.

Slave latch 14 also includes four transmission gates and two inverters. More specifically, the slave latch 14 includes transmission gates 38, 40, 42, and 44, and inverters 46, and 48. A triplet of inverters 50, 52, and 54, are coupled to the slave latch 14 to provide Q, and scan-out (SO) data.

Transmission gates 38 and 40 and inverters 46 and 52 are coupled, in series, between the master latch output 16 and the Q2 output. Inverter 54 is coupled to a node 56 between inverters 46 and 52 to the SO output. The noninverting control input to gate 38 is coupled to the B* input, and the inverting control input to the gate 38 is coupled to the B input. As was the case with the CLK* and A*, B* is used herein to represent "NOT B", i.e. the inverse of B. In the figures, B* is represented by the more conventional B with an inversion bar on top. The noninverting control input to gate 40 is coupled to the CLK input, and the inverting control input to gate 40 is coupled to the CLK* input. A node 58 is formed between gate 40 and inverter 46, and a node 60 is formed between inverters 46 and 52.

Gates 42 and 44 are coupled together in parallel and the parallel connection of gates 42 and 44 is coupled in series with inverter 48 between nodes 60 and 58. The noninverting control input to gate 42 is coupled to the B input, and the inverting control to gate 42 is coupled to the B* input. The noninverting control input to gate 44 is coupled to the CLK input, and the inverting control to gate 44 is coupled to the CLK* input. The inverter 50 is coupled between a node 62 between the gates 42 and 44 and the Q1 output.

Figure 4A:
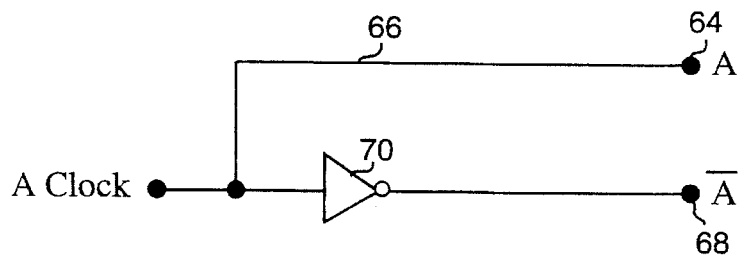
FIGS. 4a and 4b are schematic diagrams illustrating the formation of A and B clock signals.
Figure 4B:
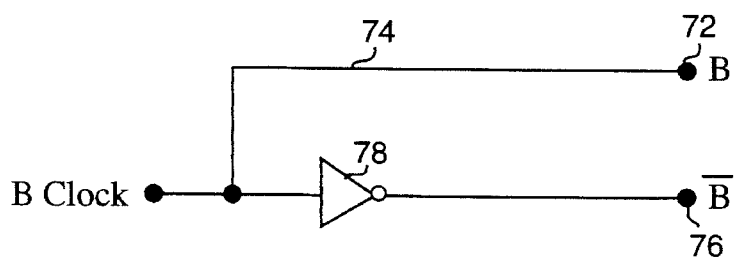

FIGS. 4a and 4b are schematics of circuits which provide the A and A* inputs and B and B* inputs, respectively, to the storage element 10 of FIG. 3. In FIG. 4a, an "A" clock is coupled to an A clock node 64 by a conductor 66 and to an A* node 68 by an inverter 70. Similarly, In FIG. 4b, a "B" clock is coupled to a B clock node 72 by a conductor 74 and to a B* node 76 by an inverter 78.

Figure 5A:
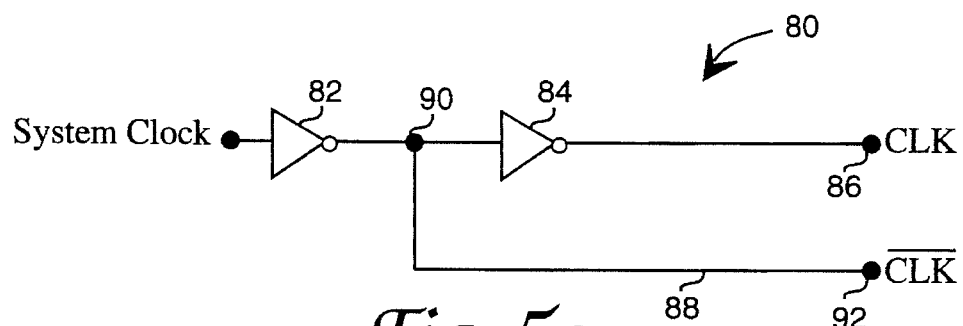
FIGS. 5a and 5b illustrate two alternate embodiments for providing CLK signals.
Figure 5B:
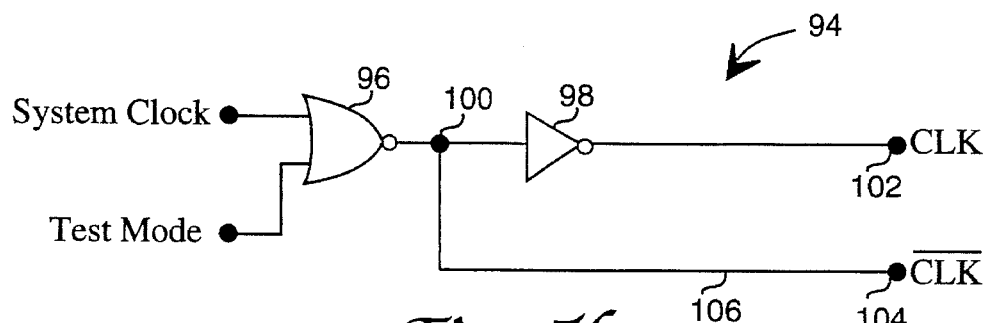

FIGS. 5a and 5b illustrate two preferred embodiments of circuits for providing the CLK and CLK* signals. In FIG. 5a, a first circuit 80 includes the series connection of a pair of inverters 82 and 84 between the system clock (i.e. the clock pulses provided by the master clock of the system) and a CLK node 86. A conductor 88 couples a node 90 located between inverters 82 and 84 to an CLK* node 92.

The circuit 80 of FIG. 5a works well for digital circuitry which relies solely on external clocks. However, when internally generated clocks are used by the digital circuitry, a second circuit 94 as illustrated in FIG. 5b is preferred. The circuit 94 includes a NOR gate 96 and an inverter 98 coupled together at a node 100. The NOR gate 96 has, as inputs, the system clock and a "Test Mode" input. The CLK signal is provided at a node 102, and the CLK* signal is provided at a node 104, which is coupled to node 100 by a conductor 106.

In circuit 94 of FIG. 5b, the simple inverter 82 of circuit 80 of FIG. 5a has been replaced by the NOR gate 96. The "Test Mode" input to NOR gate 96 is held high for the capture mode and the shift mode during the same times that the system clock is held high to ensure that the system clock in the storage element is in the right operational state. As will be explained in greater detail subsequently, the "Test Mode" signal is toggled low during the first phase of the capture operation with the system clock to allow data to be captured into the master latch section.

OPERATIONAL MODES

The three operational modes of the present invention will be discussed with reference to the schematic of FIG. 3. As will be apparent from the following descriptions, the present invention provides a storage element structure comprised of two latches which can operate in a functional mode from an edge triggered clock and in a shift mode with two, separate level sensitive scan clocks.

The functional mode is when the integrated circuit is performing its normal, operational functions. The shift mode is when bits from a "scan vector" are being sequentially shifted through the storage elements from a scan input pin and then out a scan output pin. The scan output pin can be observed to diagnose any manufacturing defects of the integrated circuit. The capture mode "captures" the current bit states of storage elements and circuit logic after an input vector has been scanned into the integrated circuit.

The shift mode alone can be used to set all storage elements to a known state by selecting the proper data sequence at the scan input pin. The capture mode mimics the functional mode in that data is latched into the master section from the "D" input, and therefore this capture operation "observes" the current bit states of storage elements and the system logic used in functional operation.

Figure 6:
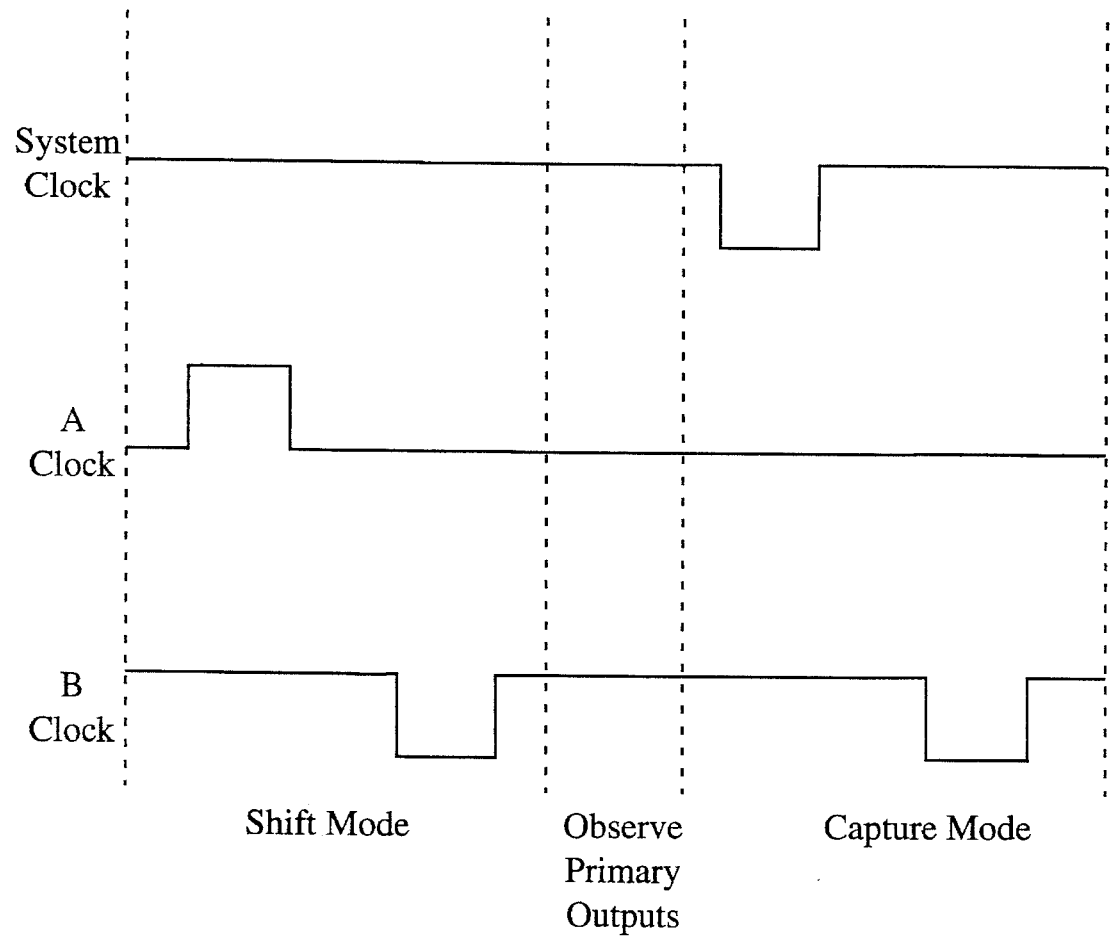
FIG. 6 is a timing diagram illustrating the test operation of the present invention.

During the scan test operation, only one clock is allowed to toggle at any one time. The scan test mode comprises the shift mode process, an "observe primary outputs" process, and a capture mode process, and is illustrated in the timing diagram of FIG. 6. Each time a clock is toggled sufficient time must be given for the clock to settle down before the next clock pulse is started. The scan test operation is accomplished by shifting data through all of the scan elements in the scan chain which are connected directly from one Scan-Out (SO) pin to the Scan-In (SI) pin of the next storage element in the chain. After the scan data shifting is completed, all clocks are paused to observe the primary output pins, if necessary. Then, functional data is captured into all of the storage elements. This data is then observed at the primary SO pin of the circuit during the subsequent shift mode operation. This sequence completes one scan test vector.

Shift mode operation is accomplished while keeping the system clock in the high state. This prevents the data at the D input from entering the master latch by keeping the gate 22 of FIG. 3 closed. It also keeps the gate 26 open so that the master latch 12 is free to operate under the control of the A scan clock. In addition, while the system clock is high the gate 40 is open, thus allowing the transfer of data between master latch 12 and slave latch 14. The fact that the latch 44 is now closed does not affect the operation of the slave latch 14 since the gate 42 is in parallel with it.

The shift mode operation is accomplished in two phases. In the first phase, data is latched from the SI pin into the master latch by toggling the A scan clock from low to high and then back to low. In the second phase, the data from the master latch 12 is latched into the slave latch 14 by toggling the B scan clock from high to low and then back high again.

The capturing of functional data during the scan test is also accomplished as a two phase operation. The first phase captures data waiting at the D input into the master latch by toggling the system clock from high to low and back to high. During this first phase, data in the slave latch 14 is not changed. The B clock in the high state during the first phase keeps the gate 38 closed so that data cannot enter the slave latch 14 even though the gate 40 is open. The gate 42 remains open so that the state in the slave latch 14 is preserved regardless of the state of the gate 44. Preserving the state of the slave latch 14 is important because it desensitizes the capture operation to any clock skew in the system clocks, particularly where there are more than one system clock that normally would not operate simultaneously in system operation but will operate that way during scan test.

After the first phase is complete, the second phase of functional data capture is accomplished by toggling the B scan clock from high to low and back high again. This transfers data from the master latch 12 to the slave latch 14 to prepare the storage element 10 for data shifting.

The ATPG software must use a flip-flop model which recognizes the state of the system clock. When the system clock input is high during capture mode, the master latch 12 will not change state and will retain the data that was shifted in during the shift mode. If the system clock input is low during capture mode, the master latch 12 will capture new data from the D input, as described previously. ATPG software is generally intelligent enough to generate some scan vectors with the internally generated clock signals low and some with them high. The key to making the present invention work with existing ATPG algorithms which are not dependent on circuit timing is to keep the state of the slave sections of the clock generating circuitry constant during capture mode. The logic in module M1 of FIG. 1 can be tested by ATPG algorithms because the outputs of the elements E in module M1 will not change state while the elements E in module M3 capture the data generating the clock in module M1. It should also be noted that the elements E in module M3 of FIG. 1 must use the alternate clock generator circuitry shown in FIG. 5b to hold the clock high during shift mode so that any changes in the internally generated clock signal does not affect or interrupt the shifting of data.

A comparison between LSSD, muxed flop, 3-latch Clocked LSSD designs, and the Dual Latch Clocked LSSD design of the present invention is shown in the table of FIG. 7. Only the Dual Latch Clocked LSSD of the present invention has a separate Capture mode which is level sensitive and which is responsive to the CLK and TEST inputs. In the prior art, the Capture mode is combined with the Functional mode. Therefore, with LSSD, the capture mode immediately causes a change in the functional Q output, which means that LSSD cannot deal with internally generated clocks. Both the muxed flop and the 3-latch Clocked LSSD have edge triggered Capture modes, which are vulnerable to clock skew. Other than these differences, the Dual Latch Clocked LSSD operates like a muxed flop or a 3-latch Clocked LSSD in the functional mode, and like a LSSD or a 3-latch clocked LSSD in the shift mode.

While this invention has been described in terms of several preferred embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. An integrated circuit with dual latch clocked LSSD comprising:

a first module responsive to a first external clock and a first external shift input and operative to produce a first shift output, wherein said first module is provided with a plurality of dual latch clocked LSSDs connected in series, each dual latch clocked LSSD having:

a first latch;

a second latch; and circuitry coupling said first latch to said second latch to provide at least three operational modes of said at least one dual latch clocked LSSD including a functional mode, a capture mode, and a shift mode; and an internal module responsive to an internal clock and said first shift output of said first module, said internal module being operative to produce a shift output.

2. An integrated circuit as recited in claim 1 wherein said internal module is provided with a plurality of said dual latch clocked LSSDs connected in series.

3. An integrated circuit as recited in claim 2 wherein said shift output of said internal module is coupled to an external output.

4. An integrated circuit as recited in claim 3 wherein said external output is created by an automatic test pattern generation (ATPG) process.

5. An integrated circuit as recited in claim 1 further comprising a second module responsive to a second external clock and a second external shift input and operative to produce a second shift output, wherein said second module includes at least one dual latch clocked LSSD.

6. An integrated circuit as recited in claim 5 wherein said second module is provided with a plurality of said dual latch clocked LSSDs connected in series.

7. An integrated circuit as recited in claim 1 wherein each of said dual latch clocked LSSD consists essentially of said first latch, said second latch, and said circuitry coupling said first latch to said second latch.

8. An integrated circuit as recited in claim 1 wherein said capture mode is level sensitive.

9. An integrated circuit as recited in claim 8 wherein said functional mode is edge triggered.

10. An integrated circuit as recited in claim 9 wherein said shift mode is level sensitive.

11. A dual latch clocked LSSD comprising:

a first latch; and a second latch; and circuitry coupling said first latch to said second latch to provide at least three operational modes of said dual latch clocked LSSD including a functional mode that is edge triggered, a capture mode that is level sensitive, and a shift mode that is level sensitive.

12. A dual latch clocked LSSD as recited in claim 11 wherein said dual latch clocked LSSD consists essentially of said first latch, said second latch, and said circuitry coupling said first latch to said second latch.

13. A dual latch clocked LSSD as recited in claim 11 wherein said functional mode and said capture mode are clocked from a signal derived from the system clock.

14. A dual latch clocked LSSD as recited in claim 13 wherein said shift mode is clocked by a pair of clocks.

15. A dual latch clocked LSSD comprising:
   a master latch responsive to a data input, a clock input derived from a system clock, an A Scan Clock input, and a scan input, and operative to produce a master latch output, wherein said master latch comprises a first gate coupled between said data input and said master latch output, second and third gates coupled in series between said scan input and a first node located between said first gate and said master latch output, and a fourth gate coupled between said master latch output and a second node between said second and third gates; and
   a slave latch responsive to said master latch output, a clock input derived from said system clock, and a B Scan Clock input, and operative to produce a data output and a scan output;
   whereby said master latch and said slave latch provide at least three operational modes of said dual latch clocked LSSD including a functional mode, a capture mode, and a shift mode.

16. A dual latch clocked LSSD as recited in claim 15 wherein said first and third gates are clocked by said clock input, and said second and fourth gates are clocked by said A Scan Clock.

17. A dual latch clocked LSSD as recited in claim 16 further comprising first inverter coupled between said first node and said master latch output and second inverter coupled between said master latch output and said fourth gate.

18. A dual latch clocked LSSD as recited in claim 17 wherein said slave latch comprises fifth and sixth gates coupled in series between said master latch output and a third node and seventh and eighth gates coupled in parallel between said third node and said data output, wherein said sixth and eighth gates are clocked by said clock input, and wherein said fifth and said seventh gates are clocked by said B Scan Clock, and further comprising a third inverter coupling said third node to said scan output, and a fourth inverter coupling said scan output to said data output.

19. A dual latch clocked LSSD as recited in claim 15 wherein said slave latch comprises fifth and sixth gates coupled in series between said master latch output and a third node and seventh and eighth gates coupled in parallel between said third node and said data output.

20. A dual latch clocked LSSD as recited in claim 19 wherein said sixth and eighth gates are clocked by said clock input, and wherein said fifth and said seventh gates are clocked by said B Scan Clock.

21. A dual latch clocked LSSD as recited in claim 20 further comprising a third inverter coupling said third node to said scan output, and a fourth inverter coupling said scan output to said data output.

22. A method for controlling a dual latch clocked LSSD comprising:
   choosing one of a functional mode, a capture mode, and a shift mode for a dual latch clocked LSSD consisting of a pair of interconnected latch storage elements;
   clocking a storage element of said dual latch clocked LSSD with an edge of a clock pulse when in said functional mode;
   capturing data into a storage element of said dual latch clocked LSSD with a level of a clock pulse when in said capture mode; and
   shifting data through a storage element of said dual latch clocked LSSD with a level of a clock pulse when in said shift mode.

23. An integrated circuit with dual latch clocked LSSD comprising:
   a module responsive to an external clock and an external shift input and operative to produce a shift output, wherein said module includes at least one dual latch clocked LSSD having:
   a first latch;
   a second latch; and
   circuitry coupling said first latch to said second latch to provide at least three operational modes of said at least one dual latch clocked LSSD including a functional mode that is edge triggered, a capture mode that is level sensitive, and a shift mode that is level sensitive.

* * * * *